(12) United States Patent
Chen

(10) Patent No.: US 9,713,275 B2
(45) Date of Patent: Jul. 18, 2017

(54) LOCK CATCH STRUCTURE

(71) Applicant: ROE Visual Co., Ltd., Shenzhen, Guangdong (CN)

(72) Inventor: Lei Chen, Shenzhen (CN)

(73) Assignee: ROE VISUAL CO., LTD., Shenzhen (CN)

( * ) Notice: Subject to any disclaimer, the term of this patent is extended or adjusted under 35 U.S.C. 154(b) by 165 days.

(21) Appl. No.: 14/305,899

(22) Filed: Jun. 16, 2014

(65) Prior Publication Data

US 2015/0305183 A1 Oct. 22, 2015

(30) Foreign Application Priority Data

Apr. 17, 2014 (CN) .......................... 2014 1 0155096

(51) Int. Cl.
| | |
|---|---|
| *E05C 19/14* | (2006.01) |
| *F16B 5/06* | (2006.01) |
| *H05K 5/02* | (2006.01) |
| *G09F 9/302* | (2006.01) |
| *G09F 9/33* | (2006.01) |

(52) U.S. Cl.
CPC ........... *H05K 5/0221* (2013.01); *E05C 19/14* (2013.01); *G09F 9/3026* (2013.01); *G09F 9/33* (2013.01); *F16B 5/0614* (2013.01); *Y10T 292/0871* (2015.04); *Y10T 292/0917* (2015.04); *Y10T 403/595* (2015.01); *Y10T 403/608* (2015.01)

(58) Field of Classification Search
CPC .......... E05C 19/10; E05C 19/12; E05C 19/14; Y10T 403/59; Y10T 403/595; Y10T 403/608; Y10T 292/0871; Y10T 292/0917; G09F 9/33; H05K 5/00; H05K 5/02; H05K 5/0221
See application file for complete search history.

(56) References Cited

U.S. PATENT DOCUMENTS

| | | | | | |
|---|---|---|---|---|---|
| 2,820,995 | A | * | 1/1958 | Schlueter .............. | E04B 1/6116 292/111 |
| 3,043,616 | A | * | 7/1962 | Magnuson .............. | E05C 19/14 292/128 |
| 3,125,367 | A | * | 3/1964 | Koch ...................... | E05C 19/14 244/153 R |
| 4,458,912 | A | * | 7/1984 | Bertonneau .............. | A63C 5/02 280/603 |
| 5,445,422 | A | * | 8/1995 | Weinerman ............. | E05C 19/14 292/247 |
| 5,667,261 | A | * | 9/1997 | Weinerman ............. | E05C 19/14 292/113 |

* cited by examiner

*Primary Examiner* — Ryan Kwiecinski

(57) ABSTRACT

The lock catch structure comprises a first lock catch main body and a second lock catch main body. The first lock catch main body comprises a first base and a first main body rotationally connected to the first base; The second lock catch structure comprises a second base, a second main body rotationally connected to the second base, a handle hinged at the base and a draw-off locking member pivoted with the handle through a pivot shaft; one end of the draw-off locking member is limited in the groove, and the handle rotates around the pivot shaft as the support point, so that the draw-off locking member drives the first lock catch main body to move towards the second lock catch main body until the first inclined surface is pressed against the second inclined main surface.

9 Claims, 1 Drawing Sheet

LOCK CATCH STRUCTURE

TECHNICAL FIELD

The invention relates to an auxiliary connecting device, in particular to a lock catch structure.

BACKGROUND TECHNOLOGY

LED screen frames are generally connected through a lock catch structure. Limited by the field during installation of the LED screen or considering the visual effect, the jointed LED screen frames are usually staggered or meet a certain inclined angle relationship, for example, the LED screen frames connected in a ring-shaped or U-shaped way, but existing lock catch structures all carry out connection in a certain single direction. Different lock catch structures are applicable to connection at different angles. However, the existing lock catch structures fail to meet demands on multi-angle or angle transformation. Meanwhile, for the temporarily built LED screen frame, it is required to dismantle the LED screen frame after use. The lock catch structures on the frame are designed for different demands and thereof may have no other purposes, causing waste of resources.

BRIEF SUMMARY OF THE INVENTION

The technical problem to be solved in the invention is to provide a lock catch structure capable of effectively adjusting the connecting angle of a display screen support.

To solve the above technical problem, the invention employs a technical solution: A lock catch structure is provided, comprising a first lock main body and a second lock catch main body which are arranged oppositely.

The first lock catch main body comprises a first base and a first main body rotationally connected to the first base; one end of the first main body comprises two opposite ends, wherein one end is provided with an inclined surface, while the other end is provided with at least one groove.

The second lock catch main body comprises a second base, a second main body rotationally connected to the second base, a handle hinged at the second base and a draw-off locking member pivoted with the handle through the pivot shaft; the second main body comprises an end; and the end is provided with a second inclined surface matched with the first inclined surface.

One end of the draw-off locking member is limited in the grove; the handle rotates around a pivot shaft as the support point such that the draw-off locking member drives the first lock catch main body to move towards the second lock catch main body until the first inclined surface is pressed against the second inclined surface.

The invention has the following beneficial effects: different from the prior art, two screen frames are correspondingly provided with a first lock catch main body and a second lock catch main body; the first main body and the second main body are correspondingly arranged and can respectively rotate relative to the first base and the second base; when connection is needed, the first main body and the second main body are rotated first such that the first inclined surface and the second inclined surface are at different relative angels; then, the draw-off locking member is limited in the groove and the handle is pulled to rotate; in such circumstances, the first lock catch main body moves towards the second lock catch main body to fulfill the aim of locking. Aiming at different angles, the invention can effectively adjust the pressing angle of the first inclined surface and the second inclined surface through rotating the first main body and the second main body, so that the locking angles of the two frames are adjusted, and the use is convenient and easy.

Description of Mark Numbers:

1. the first lock catch main body; 11. the first base; 12; the first rotating terminal; 13, the first pressing terminal; 14. the first inclined surface; 15. groove; 2. the second lock catch main body; 21. the second base; 22. the second pressing terminal; 23. the second inclined surface; 24. handle; 25. draw-off locking member; 26. pivot shaft; 27. limiting groove; 28. sliding chute; 29. trench; 3. anti-resetting mechanism; 31. torsional spring; 32. connecting member; 33. projection; 34. pin shaft.

DETAILED DESCRIPTION OF THE INVENTION

The technical contents, structural features, objective and effects of the invention are described in detail with reference to embodiments and attached drawings.

Different from the prior art, the first base and the second base are respectively rotationally connected with a first main body and a second main body; and the ends of the first main body and the second main body are correspondingly provided with a first inclined surface and a second inclined surface. The first main body and the second main body are rotated to change the pressing angle of the first inclined surface and the second inclined surface, thus controlling the locking angle. The invention can adjust the connecting angle and is conveniently and easily used.

Figure 1:
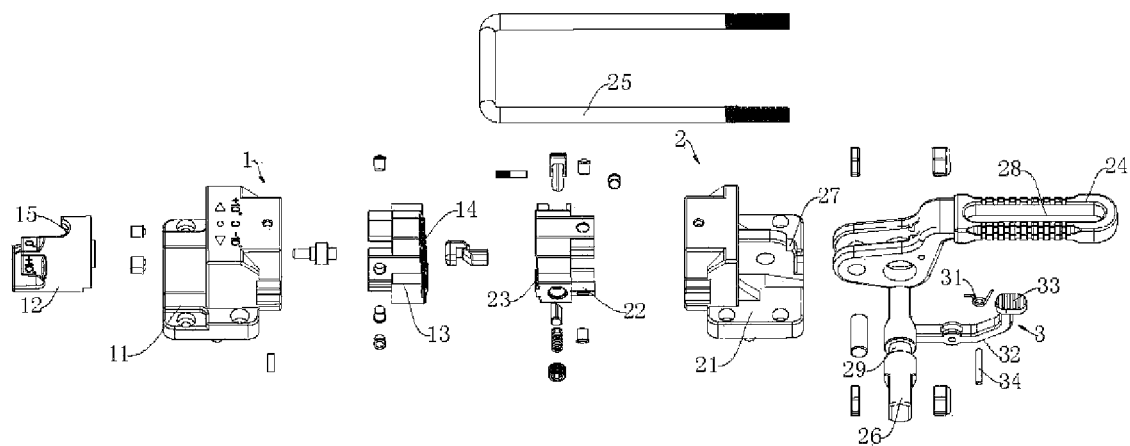
FIG. 1 is an exploded view of the structure in a preferable embodiment of the invention.

A lock catch structure as shown in FIG. 1 comprises a first lock catch main body 1 and a second lock catch main body 2 which are arranged oppositely. The first lock catch main body 1 comprises a first base 11 and a first main body rotationally connected to the first base 11. The first main body comprises two opposite ends, wherein one end is provided with an inclined surface 14 and the other end is provided with at least one groove 15.

The second lock catch main body 2 comprises a second base 21, a second main body rotationally connected to the second base 21, a handle 24 hinged at the second base 21 and a draw-off locking member 25 which is pivoted with the handle 24 through a pivot shaft 26. The second main body comprises an end, and the end is provided with a second inclined surface 23 matched with the first inclined surface 14.

One end of the draw-off locking member 25 is limited in the groove 15, and the handle 24 rotates around the second base 21 such that the draw-off locking member 25 drives the first lock catch main body 1 to move towards the second lock catch main body 2 until the first inclined surface 14 is pressed against the second inclined surface 23, thus locking the first lock catch main body 1 with the second lock catch main body 2.

In this embodiment, the first inclined surface 14 and the second inclined surface 23 are straight and flat inclined surfaces. Of course, in other embodiments, the first inclined surface 14 and the second inclined surface 23 may also be inclined surfaces with slight recessions or projections.

In the structure, two screen frames are correspondingly provided with a first lock catch main body 1 and a second lock catch main body 2; the first main body and the second main body are corresponding arranged and can respectively rotate relative to the first base 11 and the second base 21; when connection is needed, the first main body and the second main body are rotated first such that the first inclined surface 14 and the second inclined surface 23 have different relative angels; then, the draw-off locking member 25 is limited in the groove 15 and the handle is pulled to rotate; in such circumstances, the first lock catch main body 1 moves towards the second lock catch main body 2 to fulfill the aim of locking. Aiming at different angles, the invention can effectively adjust the pressing angle of the first inclined surface 14 and the second inclined surface 23 through rotating the first main body and the second main body, so that the locking angles of the two frames are adjusted, and the use is convenient and easy.

In this embodiment, the first main body comprises a first rotating terminal 12 in rotational connection and a first pressing terminal 13; the groove 15 is formed on the outer wall surface of the first rotating terminal 12; and the first inclined surface 14 is formed on the first pressing terminal 13. The first rotating terminal 12 and the first pressing terminal 13 are rotationally connected to the base. The first rotating terminal 12 can rotate to adjust the position of the groove 15, while the first pressing terminal 13 can rotate to adjust the orientation of the inclined surface so as to better match the second inclined surface 23 and the draw-off locking member 25.

Figure 2:
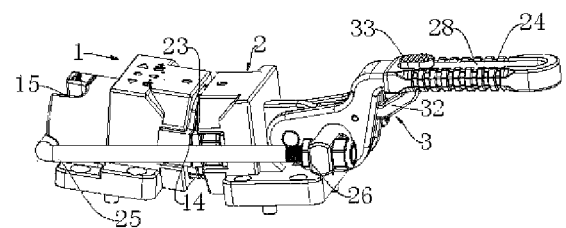
FIG. 2 is a structural view of a preferable embodiment of the invention in the inner arc-shaped connection state.
Figure 3:
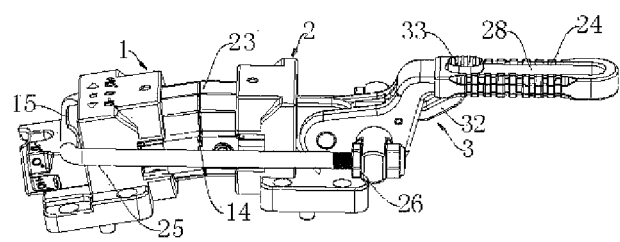
FIG. 3 is a structural view of a preferable embodiment of the invention in the outer arc-shaped connection state.
Figure 4:
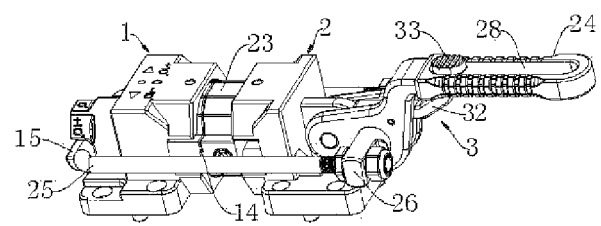
FIG. 4 is a structural view of a preferable embodiment of the invention in the linear connection state.

Aiming at the structure of the first pressing terminal 13 and to better match with the first pressing terminal 13, the second main body comprises a second pressing terminal 22 corresponding to the first pressing terminal 13, and the second inclined surface 23 is formed on the second pressing terminal 22. Refer to FIG. 2. Through rotating the first pressing terminal 13 and the second pressing terminal 22, the inclined surfaces on the two pressing terminals have different orientations, for example the outer arc shape at the angle as shown in FIG. 2, or the inner arc shape as shown in FIG. 3 through rotation, and also the straight line shape as shown in FIG. 4 when rotating at a proper angle.

The outer surface of the first rotating terminal 12 is provided with two grooves 15. One of the two grooves 15 is opened at the middle of the first rotating terminal 12, and the other is formed at the edge of the first rotating terminal 12. Rotating the groove 15 on the first rotating terminal 12 to different positions can change the matching relationship with the draw-off locking member 25. Aiming at different angles, different grooves 15 can be used to effectively ensure the overall strength of the locking structure.

Preferably, two grooves 15 as shown in FIG. 1 are mutually vertical. Of course, in other embodiments, the grooves 15 may be distributed in other ways, as long as achieving the effect of match locking and strength enhancement.

In this embodiment, the draw-off locking member 25 comprises a U-shaped lock sleeve. The open end of the U-shaped lock sleeve is provided with screw threads. The two ends of the pivot shaft 26 are provided with through-holes. The U-shaped lock sleeve is connected to the through-hole. As shown in FIG. 2, FIG. 3, and FIG. 4, the open end of the U-shaped lock sleeve is provided with screw threads and is connected to the position of the through-hole of the pivot shaft 26. Match between the screw threads and the nut can ensure demands on length of the U-shaped lock sleeve, meeting locking conditions.

Furthermore, at the position of preventing the handle 24 from resetting after the first lock catch main body 1 and the second lock catch main body 2 are relatively locked, the handle 24 is provided with an anti-resetting mechanism 3.

Preferably, the anti-resetting mechanism 3 comprises a torsional spring 31; one end of the torsional spring 31 is supported against the handle 24, and the other end is supported against the second base 21. The resetting force of the torsional spring 31 pressing against the handle 24 effectively avoids looseness after locking caused by resetting of the handle 24.

In this embodiment, the re-setting mechanism 3 comprises a connecting member 32. The connecting member 32 comprises an arc-shaped base, a projection 33 arranged at one end of the arc-shaped base, an accommodating slot formed on the arc-shaped base and the torsional spring 31. The torsional spring 31 is connected into the accommodating slot through a pin shaft 34; the second base 21 is formed with a limiting groove 27; and the handle 24 is formed with a sliding chute 28.

The arc-shaped base is connected to the second base 21 through the pin shaft 34, having one end pressed against the limiting groove 27 and the other end with the projection 33 which is slidably arranged in the sliding chute 28. One end of the torsional spring 31 is supported against the arc-shaped connecting member 32, and the other end is supported against the second base 21.

To facilitate installation of the torsional spring 31 and effectively ensuring the spring force, the pivot shaft 26 is provided with a trench 29. The other end of the torsional spring 31 is supported against the trench 29.

All in all, two frames are correspondingly provided with the first lock catch main body 1 and the second lock catch main body 2, and the first main body and the second main body correspond to each other and can respectively rotate relative to the first base 11 and the second base 21. When connection is needed, the first main body and the second main body are first rotated such that the first lock catch main body 1 and the second lock catch main body 2 have different opposite faces; then, the draw-off locking member 25 is limited in the groove 15 and the handle is pulled to rotate, so that the first lock catch main body 1 moves towards the second lock catch main body 2 to fulfill the aim of locking. Aiming at the different angles, the first main body and the second main body, so the locking angle between the two frames can be effectively adjustment and the use is convenient and easy. On such basis, grooves 15 arranged at different positions can effectively ensure the locking strength at a certain angle, and the anti-resetting mechanism 3 is further arranged to effectively avoid separation of the locked handle 24 caused by resetting.

The above are only embodiments of the invention, and cannot limit the patent scope of the invention. Any equivalent structure or equivalent flow transformation made according to the specification and attached drawings of the invention, or direct or indirect use in other related technical field shall be incorporated in the protective scope of the claims of the invention.

What is claimed is:

1. A lock catch structure, comprising a first lock catch main body and a second lock catch main body arranged oppositely, characterized in that, the first lock catch main body comprises a first base and a first main body rotationally connected to the first base, and the first main body comprises two opposite ends, wherein one end is provided with an inclined surface, and the other end is provided with at least one groove; the second lock catch main body comprises a second base, a second main body rotationally connected to the second base, a handle hinged at the second base and a draw-off locking member pivoted with the handle through a pivot shaft; the second main body comprises an end, and the end is provided with a second inclined surface matched with the first inclined surface; one end of the draw-off locking member is limited in the at least one groove; the handle rotates around a pivot shaft as the support point such that the draw-off locking member drives the first lock catch main body to move towards the second lock catch main body until the first inclined surface is pressed against the second inclined surface; wherein the first main body comprises a first rotating terminal in rotational connection and a first pressing terminal; the at least one groove is formed on an outer wall surface of the first rotating terminal; and the first inclined surface is formed on the first pressing terminal.

2. The lock catch structure according to claim 1, characterized in that the second main body comprises a second pressing terminal corresponding to the first pressing terminal; and the second inclined surface is formed on the second pressing terminal.

3. The lock catch structure according to claim 1, characterized in that the draw-off locking member comprises a U-shaped lock sleeve; an open end of the U-shaped lock sleeve is provided with screw threads; two ends of the pivot shaft are provided with a first through hole and a second through hole respectively; and the U-shaped lock sleeve is connected to the first through-hole and the second through-hole through a nut respectively.

4. The lock catch structure according to claim 1, characterized in that the handle is provided with an anti-resetting mechanism.

5. The lock catch structure according to claim 4, characterized in that the anti-resetting mechanism comprises a torsional spring; one end of the torsional spring is supported against the handle, and the other end of the torsional spring is supported against the second base.

6. The lock catch structure according to claim 5, characterized in that the anti-resetting mechanism comprises a connecting member; the connecting member comprises an arc-shaped base, a projection arranged at one end of the arc-shaped base, an accommodating slot formed on the arc-shaped base, and the torsional spring; the torsional spring is connected in the accommodating slot through a pin shaft; the second base is formed with a limiting groove; and the handle is formed with a sliding chute; the arc-shaped base is connected to the second base through the pin shaft, having one end pressed against the limiting groove and the other end with the projection which is slidably arranged in the sliding chute; one end of the torsional spring is supported against the arc-shaped connecting member, and the other end of the torsional spring supported against the second base.

7. The lock catch structure according to claim 6, characterized in that the pivot shaft is provided with a trench, and the other end is supported against and in the trench.

8. A lock catch structure, comprising a first lock catch main body and a second lock catch main body arranged oppositely, characterized in that, the first lock catch main body comprises a first base and a first main body rotationally connected to the first base, and the first main body comprises two opposite ends, wherein one end is provided with an inclined surface, and the other end is provided with two grooves; the second lock catch main body comprises a second base, a second main body rotationally connected to the second base, a handle hinged at the second base and a draw-off locking member pivoted with the handle through a pivot shaft; the second main body comprises an end, and the end is provided with a second inclined surface matched with the first inclined surface; one end of the draw-off locking member is limited in one of the two grooves; the handle rotates around a pivot shaft as the support point such that the draw-off locking member drives the first lock catch main body to move towards the second lock catch main body until the first inclined surface is pressed against the second inclined surface; the first main body comprises a first rotating terminal in rotational connection and a first pressing terminal; the first inclined surface is formed on the first pressing terminal; an outer surface of the first rotating terminal is provided with the two grooves, wherein one of the two grooves is formed in a middle of the first rotating terminal, and the other of the two grooves is formed at an edge of the first rotating terminal.

9. The lock catch structure according to claim 8, characterized in that the two grooves are perpendicular to each other.

* * * * *